(12) United States Patent
Shi et al.

(10) Patent No.: US 8,334,149 B2
(45) Date of Patent: Dec. 18, 2012

(54) MECHANICAL COUPLING IN A MULTI-CHIP MODULE USING MAGNETIC COMPONENTS

(75) Inventors: Jing Shi, Carlsbad, CA (US); Hiren D. Thacker, San Diego, CA (US); Ashok V. Krishnamoorthy, San Diego, CA (US); John E. Cunningham, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 0 days.

(21) Appl. No.: 13/467,671

(22) Filed: May 9, 2012

(65) Prior Publication Data
US 2012/0220056 A1 Aug. 30, 2012

Related U.S. Application Data

(62) Division of application No. 12/568,024, filed on Sep. 28, 2009, now Pat. No. 8,188,581.

(51) Int. Cl.
*H01L 21/00* (2006.01)

(52) U.S. Cl. .................................. 438/3; 257/E21.506

(58) Field of Classification Search .................. 438/3
See application file for complete search history.

(56) References Cited

U.S. PATENT DOCUMENTS

| 6,495,396 B1 * | 12/2002 | Drost ............................ 438/107 |
| 6,544,430 B2 * | 4/2003 | McCormack et al. .......... 216/67 |
| 2002/0084536 A1 | 7/2002 | Sundahl et al. |
| 2008/0042266 A1 | 2/2008 | Kagaya et al. |

* cited by examiner

*Primary Examiner* — Chandra Chaudhari
(74) *Attorney, Agent, or Firm* — Park, Vaughan, Fleming & Dowler LLP; Anthony P. Jones (57) ABSTRACT

A multi-chip module (MCM) is described. This MCM includes at least two substrates that are remateably mechanically coupled by positive and negative features on facing surfaces of the substrates. These positive and negative features mate with each other. In particular, a positive feature may mate with a given pair of negative features, which includes negative features on each of the substrates. Furthermore, at least one of the negative features in the given pair may include a hard magnetic material, and the positive feature and the other negative feature in the given pair may include a soft magnetic material that provide a flux-return path to the hard magnetic material. In this way, the hard magnetic material may facilitate the remateable mechanical coupling of the substrates.

17 Claims, 12 Drawing Sheets

MECHANICAL COUPLING IN A MULTI-CHIP MODULE USING MAGNETIC COMPONENTS

RELATED CASES

This application is a divisional application of, and hereby claims priority under 35 U.S.C. §120 to, pending U.S. patent application Ser. No. 12/568,024, titled "Mechanical Coupling in a Multi-Chip Module Using Magnetic Components," by inventors Jing Shi, Hiren D. Thacker, Ashok V. Krishnamoorthy and John E. Cunningham, which was filed on 28 Sep. 2009, and which is hereby incorporated by reference.

GOVERNMENT LICENSE RIGHTS

The United States Government has a paid-up license in this invention and the right in limited circumstances to require the patent owner to license others on reasonable terms as provided for by the terms of Agreement No. HR0011-08-9-0001 awarded by the Defense Advanced Research Projects Administration.

BACKGROUND

1. Field

The present disclosure generally relates to multi-chip modules (MCMs). More specifically, the present disclosure relates to an MCM that includes substrates that are mechanically coupled using magnetic components.

2. Related Art

As integrated-circuit (IC) technology continues to scale to smaller critical dimensions, it is increasingly difficult for existing inter-chip connections to provide suitable communication characteristics, such as: high bandwidth, low power, reliability and low cost. A variety of interconnect technologies have been proposed to address this problem, including proximity communication or PxC (for example, using capacitive inter-chip contacts).

PxC based on capacitive inter-chip contacts provides dense inter-chip connections, with a pitch between neighboring pads on the order of 10-100 μm. However, PxC introduces additional packaging challenges. In particular, in order to achieve high-bandwidth/high-data-rate inter-chip communication, PxC typically requires mechanical alignment between facing chips on the same order as the pitch between neighboring pads. In addition, in order to allow chips in multi-chip modules (MCMs) that use PxC to be replaced (as needed), a remateable assembly technique is desirable.

One purely mechanical assembly technique that provides highly accurate and remateable mechanical coupling of chips in an MCM includes balls and pits. In this assembly technique, adjacent chips in the MCM are aligned by placing the balls into collocated pits on surfaces of the chips.

Figure 1:
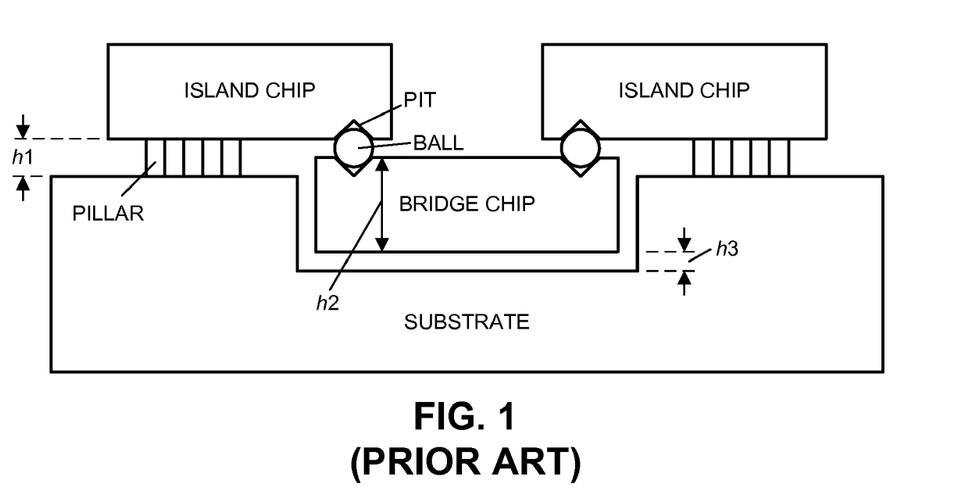
FIG. 1 is a block diagram illustrating an existing multi-chip module (MCM).

An existing MCM that includes balls and pits is shown in FIG. 1. In this MCM, island chips (such as processors) are placed face-down, and a bridge chip is placed face-up. Note that the chips receive signals, power and ground from the package substrate through C4 solder and/or copper pillars as level-one interconnects, and that the bridge chip communicates with the chips using PxC.

Typically, there are mechanical clearances, h1, h2 and h3, between the components in this existing MCM. However, given these mechanical clearances, it is difficult to remateably support the bridge chip in FIG. 1 while maintaining the alignment of the balls and pits. For example, because of mechanical clearance h3, if the balls are merely placed into the pits (which provides remateable mechanical coupling) there is no normal or restoring force to oppose the force of gravity on the bridge chip. Consequently, the bridge chip will fall away from the island chips, which results in misalignment and poorer PxC.

Hence, what is needed is an MCM without the above-described problems.

SUMMARY

One embodiment of the present disclosure provides a multi-chip module (MCM) that includes: a first substrate having a first surface, a second substrate having a second surface that faces the first surface, and positive features. Note that the first substrate includes first negative features disposed on the first surface, where a given first negative feature is recessed below the first surface and has an opening, defined by an edge. Moreover, at least a subset of the first negative features includes a first magnetic material. Furthermore, the positive features mechanically couple the first substrate and the second substrate by mating with associated first negative features, where the mechanical coupling is facilitated by the first magnetic material.

In some embodiments, the positive features are disposed on the second surface, where a given first positive feature protrudes above the second surface. Furthermore, the positive features may include a second magnetic material. For example, the second magnetic material may include a soft magnetic material at room temperature.

Note that the first magnetic material may include a hard magnetic material at room temperature. Furthermore, the first material may undergo a ferromagnetic to anti-ferromagnetic phase transition above a given temperature, thereby facilitating disassembly of the MCM.

Additionally, a remainder of the first negative features may include the second magnetic material.

In some embodiments, the second substrate includes second negative features disposed on the second surface, where a given second negative feature is recessed below the second surface and has an opening, defined by an edge. Moreover, the given second negative feature may be associated with the given first negative feature, thereby defining a given pair of negative features.

Note that at least a subset of the second negative features may include the first magnetic material. Furthermore, at least the subset of the second negative features may have a mirror spatial configuration relative to at least the subset of the first negative features so that, in the given pair of negative features, only one of the given first negative feature and the given second negative feature includes the first magnetic material. Additionally, a remainder of the second negative features may include the second magnetic material.

In some embodiments, the positive features may be separate from the second substrate. For example, the positive features may include microspheres, and a given microsphere may, at least in part, mate with the given first negative feature and the given second negative feature. Note that the positive features may include the second magnetic material.

In some embodiments, the second substrate includes the second magnetic material, which provides a flux-return path to at least the subset of the first negative features which include the first magnetic material.

Another embodiment provides an electronic device that includes the MCM.

Another embodiment provides a method for fabricating the first substrate for use in the MCM. During the method, the first negative features are defined on the first surface of the first substrate, where the given first negative feature is recessed below the first surface and has an opening, defined by an edge. Then, a seed layer is deposited in at least the subset of the first negative features. Next, the first magnetic material is deposited on the seed layer in at least the subset of the first negative features. Note that the seed layer defines an orientation of a magnetic axis of the first magnetic material. Moreover, the first substrate is configured to mechanically couple in the MCM to the second substrate having the second surface that faces the first surface via positive features in the MCM that are configured to mate with the first negative features. Furthermore, the mechanical coupling is facilitated by the first magnetic material.

BRIEF DESCRIPTION OF THE FIGURES

Note that like reference numerals refer to corresponding parts throughout the drawings. Moreover, multiple instances of the same type of part are designated by a common prefix separated from an instance number by a dash.

DETAILED DESCRIPTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a multi-chip module (MCM), an electronic device that includes the MCM, and a technique for fabricating a substrate in the MCM are described. This MCM includes at least two substrates that are remateably mechanically coupled by positive features (such as microspheres or balls) and negative features (such as pits) on facing surfaces of the substrates. These positive and negative features mate with each other. In particular, a positive feature may mate with a given pair of negative features, which includes negative features on each of the substrates. Furthermore, at least one of the negative features in the given pair may include a hard magnetic material, and the positive feature and the other negative feature in the given pair may include a soft magnetic material that provide a flux-return path to the hard magnetic material. In this way, the hard material may facilitate the remateable mechanical coupling of the substrates.

In addition to remateably coupling the substrates, this mechanical-coupling technique may align the substrates, and may be compatible with high-volume manufacturing. In particular, the positive and negative features may be fabricated on the surfaces using semiconductor-process techniques, and the hard magnetic material may enhance yield during assembly by preventing the positive features from falling out of the negative features. Furthermore, because the mechanical coupling is remateable, the MCM can be reworked, which may reduce the extent of chip testing prior to assembly of the MCM. Therefore, this mechanical-coupling technique may reduce the cost of the MCM.

We now describe embodiments of an MCM. In the discussion that follows, static magnetic forces provided by a magnetic ball-and-pit structure are used to mechanically couple and maintain the relative positions of components in the MCM, both during and after assembly. Furthermore, by changing the magnetic properties and the geometry of the magnetic materials in the magnetic ball-and-pit structure, the resulting magnetic forces can be selected so that components in the MCM, such as island chips and/or bridge chips, are remateable.

Figure 2A:
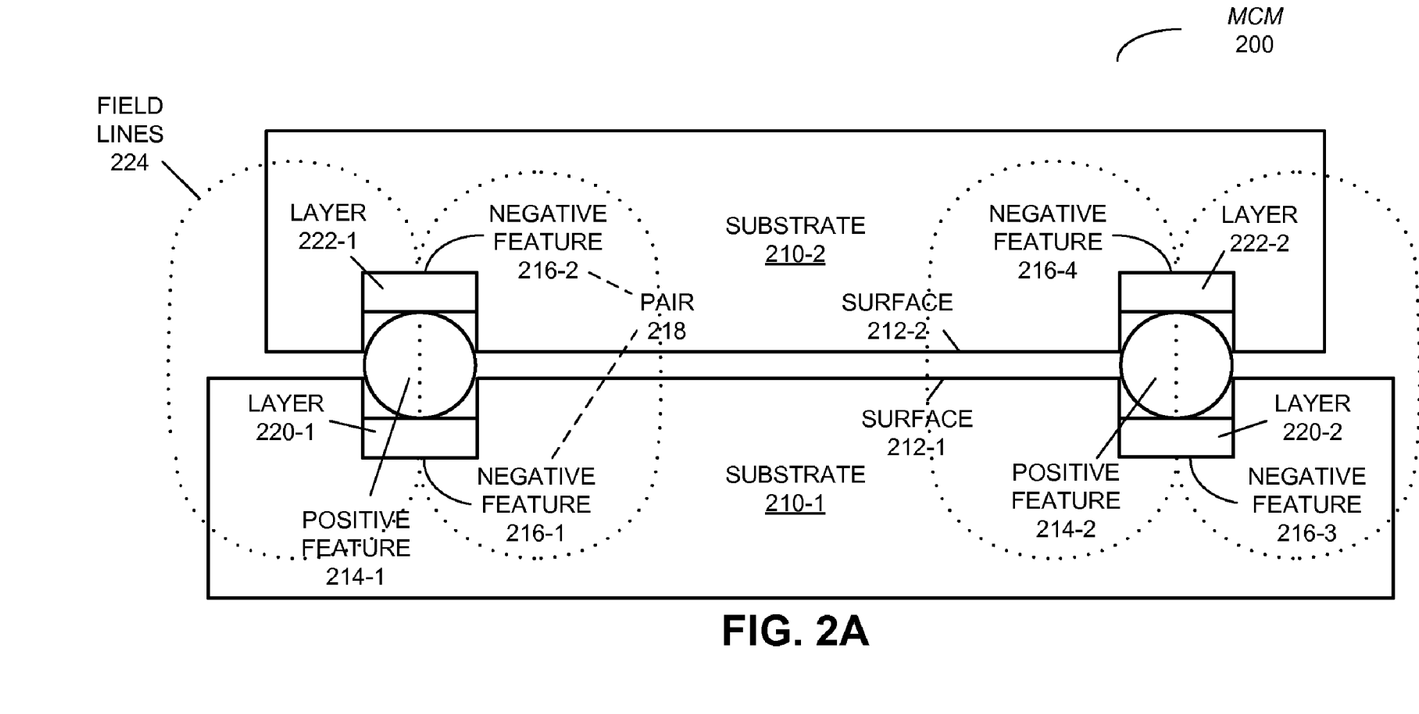
FIG. 2A is a block diagram illustrating an MCM in accordance with an embodiment of the present disclosure.

FIG. 2A presents a block diagram illustrating a side view of an MCM 200. This MCM includes: a substrate 210-1 having a surface 212-1, a substrate 210-2 having a surface 212-2 that faces surface 212-1, and positive features 214 (such as microspheres or balls). Note that substrates 210 include negative features 216 (such as pits) disposed on surfaces 212, where a given negative feature (such as negative feature 216-1) is recessed below a given surface (such as surface 212-1) and has an opening, defined by an edge. Moreover, a given negative feature on surface 212-1 (such as negative feature 216-1) may be associated with a given negative feature on surface 212-2 (such as negative feature 216-2), thereby defining a given pair 218 of negative features.

Figure 3:
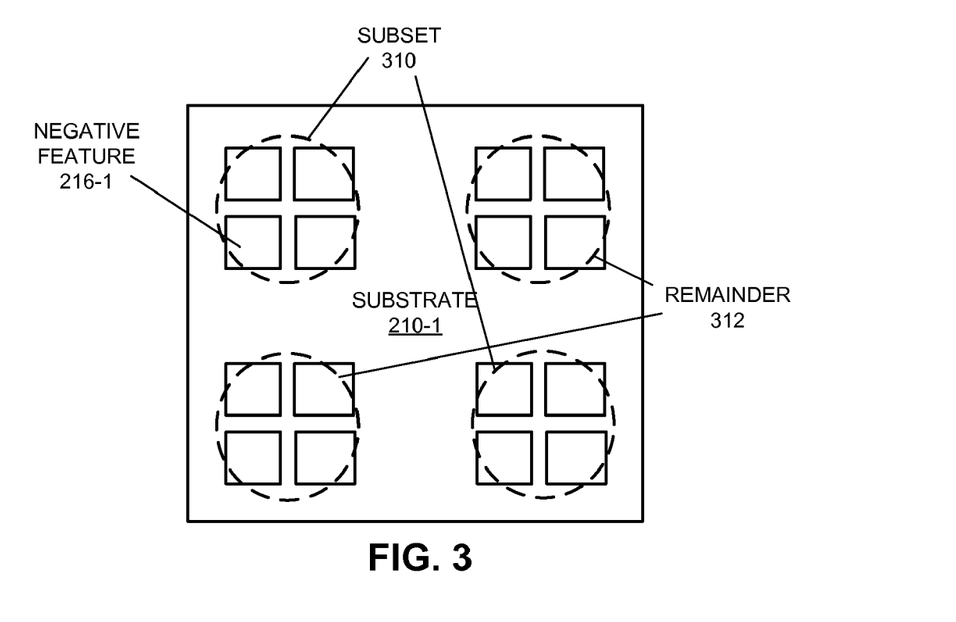
FIG. 3 is a block diagram illustrating a substrate for use in an MCM in accordance with an embodiment of the present disclosure.

As shown below in FIG. 3, at least a subset of negative features 216 may include a first magnetic material in layers 220, and a remainder of negative features 216 may include a second magnetic material in layers 222. Furthermore, positive features 214 mechanically couple substrates 210 by mating with associated negative features 216 (for example, in pair 218). This mechanical coupling may be facilitated by static magnetic forces associated with the first magnetic material in layers 220.

Note that the first magnetic material may include a hard magnetic material, such as a permanent magnet that has a large remnant magnetization in zero external magnetic field. This hard magnetic material may include a ferromagnetic material or a ferrimagnetic material at room temperature, such as: an alloy of: iron, cobalt, iron-oxide, manganese, manganese-bismuth, nickel, antimony, nickel-iron, samarium-cobalt, neodymium, barium-titanate, and/or strontium-barium-titanate. In some embodiments, the Curie temperature of the hard magnetic material is greater than 500 C so that assembly processes, such as bonding and solder reflow, do not affect the magnetic properties.

Furthermore, the second magnetic material may include a soft magnetic material, i.e., a material with a large magnetic susceptibility (or permeability), a low coercivity and a negligible remnant magnetization in zero external magnetic field. This soft magnetic material may include a paramagnetic material, a ferromagnetic material or a ferromagnetic material at room temperature, such as a nickel-iron alloy. Additionally, positive features 214 may include the second magnetic material. The second magnetic material in these components may provide flux-return path to the first magnetic material in layers 220 (as illustrated by the dashed field lines 224). This flux-return path may be enhanced by the orientation of hard magnetic axes in the second magnetic material. For example, positive features 214 may each have a hard axis that is approximately perpendicular to surfaces 212 in the plane of FIG. 2A. Alternatively, positive features 214 may have four-fold symmetry, so that each positive feature (such as positive feature 214-1) has a hard axis every 90° in the plane of FIG. 2A. This configuration may ensure that a hard axis of each of the positive features 214 is within 45° of the perpendicular to surfaces 212.

In some embodiments, the shape of positive features 214, at least in part, determines the orientation of the hard axis in these components. For example, the positive features 214 may each have an elliptical shape.

During assembly of MCM 200, positive features 214 may be placed into negative features 216 on individual dies or substrates 210 while they are still in wafer form. The static magnetic forces may help hold positive features 214 in place when the chips are flipped, aligned with and mechanically coupled to chips having collocated negative features 216. Note that this mechanical-coupling technique is compatible with the MCM configuration shown in FIG. 1, and may provide a restoring force that holds the bridge chips in place.

Figure 2B:
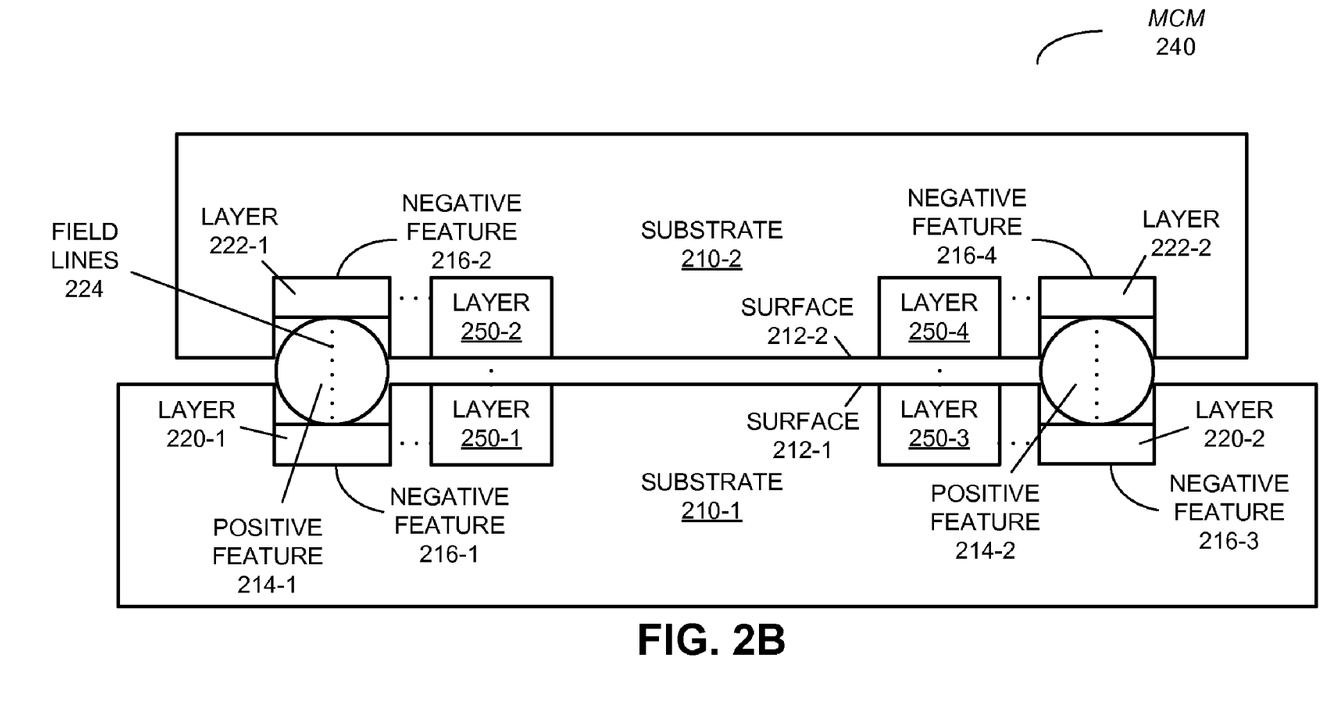
FIG. 2B is a block diagram illustrating an MCM in accordance with an embodiment of the present disclosure.

A variety of configurations may be used to increase the strength of the static magnetic forces. For example, as shown in FIG. 2B, which presents a block diagram illustrating a side view of an MCM 240, either or both of substrates 210 may include additional layers 250 that include the second magnetic material. These additional layers may provide a flux-return path to layers 220 that include the first magnetic material (e.g., field lines 224 may go from layer 220-1, through positive feature 214-1, layer 222-1, layer 250-2, layer 250-1 and back to layer 220-1).

Figure 2C:
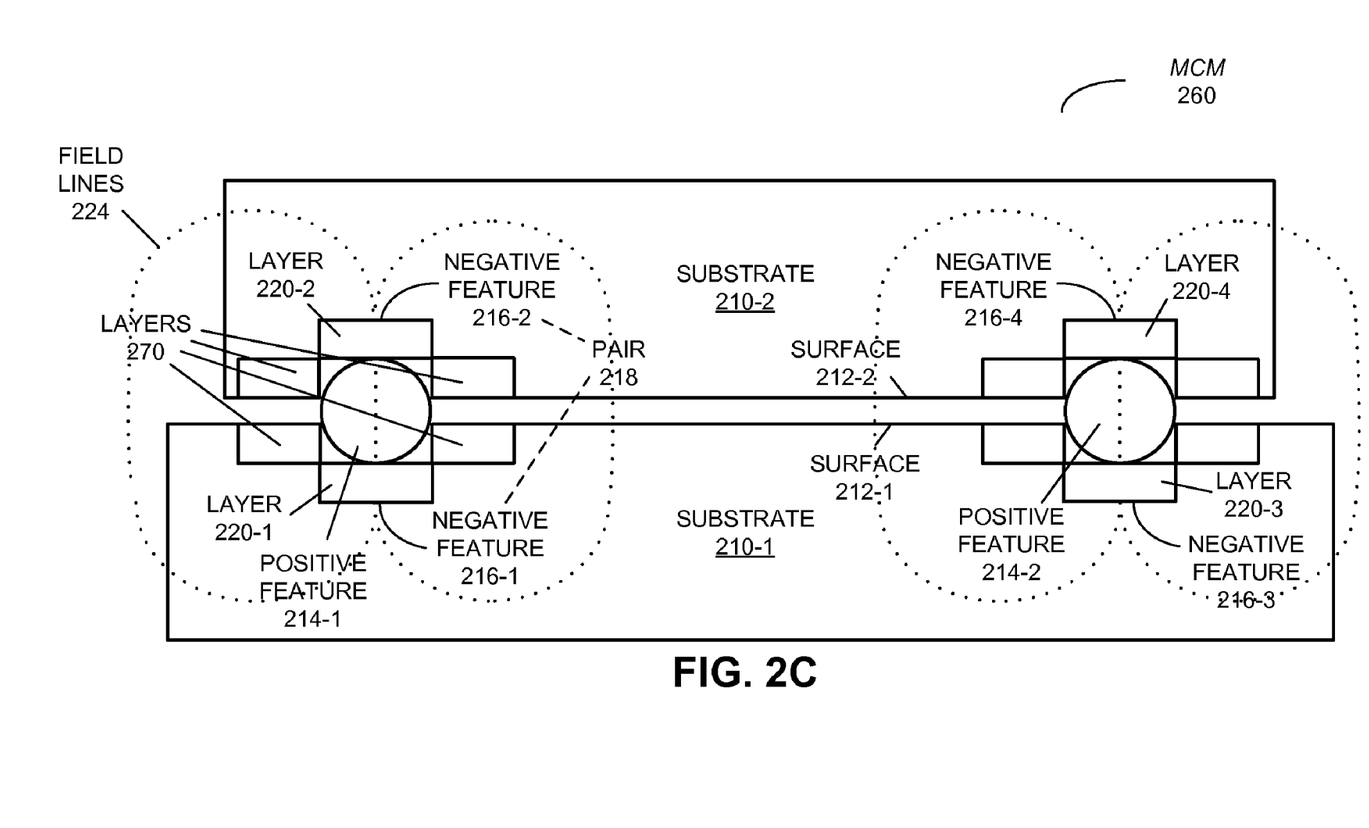
FIG. 2C is a block diagram illustrating an MCM in accordance with an embodiment of the present disclosure.

In some embodiments, both negative features in a given pair of negative features (such as pair 218) include the first magnetic material. This is shown in FIG. 2C, which presents a block diagram illustrating a side view of an MCM 260. In this MCM, the orientation (north-south) of the magnetization of the first magnetic material in the negative features on substrate 210-1 may be opposite to the orientation (north-south) of the magnetization of the first magnetic material in the negative features on substrate 210-2.

Note that the first magnetic material may extend beyond negative features 216 in optional layers 270, thereby providing traces that increase the strength of the static magnetic force between substrates 210. Additionally, in some embodiments positive features 214 include the first magnetic material. For example, positive features 214 may include a demagnetized ferrimagnetic material or ferromagnetic material (such as iron), which may be magnetized by the external magnetic field provided by the first magnetic material in layers 220. Alternatively, the positive features 214 may be magnetized by an external magnetic field during the assembly of MCM 260. However, in some embodiments positive features 214 include a ferrimagnetic material or a ferromagnetic material that is magnetized prior to the assembly of MCM 260. In these embodiments, pick-and-place equipment may be used to keep positive features 214 from mechanically coupling to each other during the assembly process.

Figure 2D:
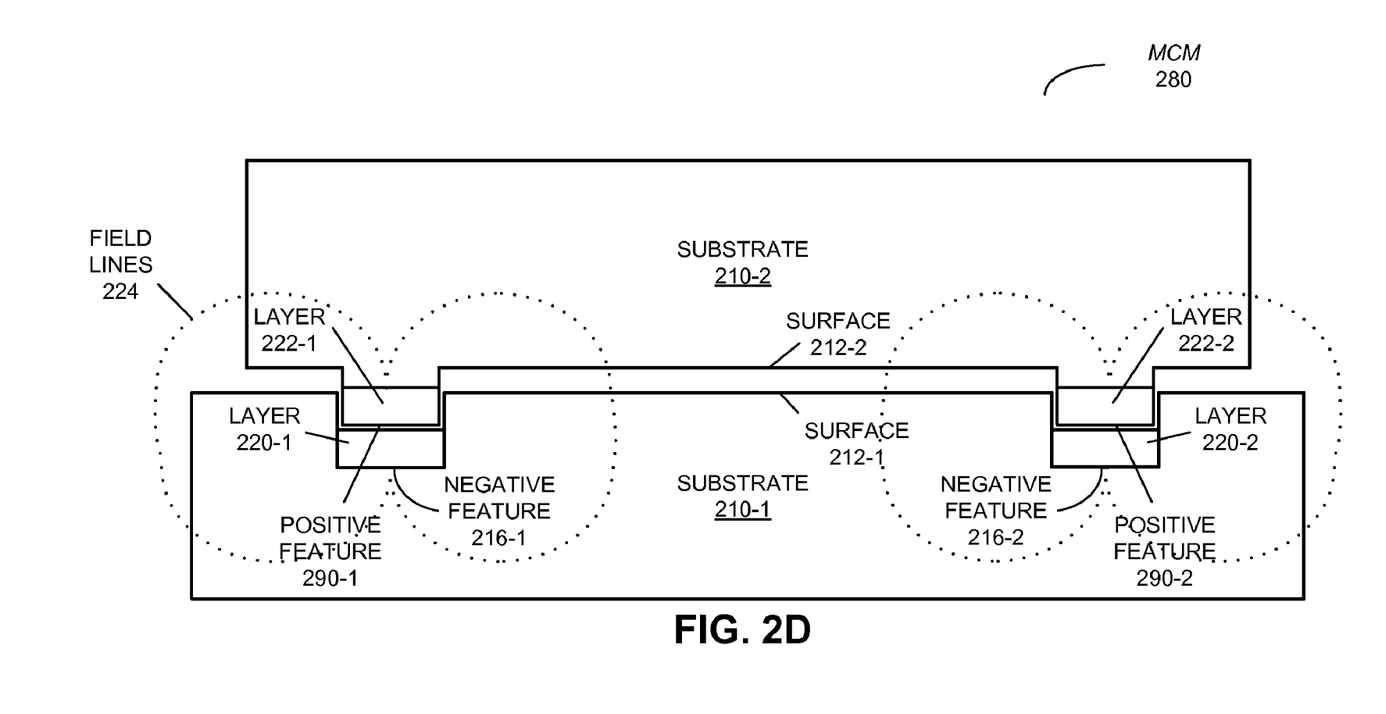
FIG. 2D is a block diagram illustrating an MCM in accordance with an embodiment of the present disclosure.

While the preceding examples illustrated positive features 214 as being separate from substrates 210, in some embodiments positive features are disposed on one of substrates 210. This is shown in FIG. 2D, which presents a block diagram illustrating a side view of an MCM 280. In particular, positive features 290 are disposed on and protrude above surface 212-2. Alternatively, positive features 290 may be disposed on surface 212-1 or on both surfaces 212. As shown in FIG. 2D, in some embodiments positive features 290 include the second magnetic material. Alternatively, positive features 290 may include the first magnetic material.

Note that positive features 214 (FIGS. 2A-2C) and/or 290 may have a wide variety of shapes, including: a sphere, a hemisphere, a top hat or a pyramid shape. Similarly, negative features 216 in these embodiments can include: a pit, a trench, an inverse pyramidal shape and/or a groove.

As noted previously, in some embodiments only a subset of negative features 216 may include the first magnetic material. This configuration may prevent the occurrence of a 'conflict' between the magnetic orientations of the magnetization in layers 220 in a given pair (such as when a north pole faces a north pole or a south pole faces a south pole, which results in a repulsive force between substrates 210). In addition, if the negative features in the subset have an asymmetric configuration, then by rotating a chip the mirror-image configuration may be obtained. This is shown in FIG. 3, which presents a block diagram illustrating a top view of a substrate 210-1. Because the negative features on substrate 210 in subset 310 that include the first magnetic material interdigit with their mirror image (and with the mirror image of negative features 216 in remainder 312 that include the second magnetic material), this configuration ensures that only one of the negative features in the given pair includes the first magnetic material. It also allows chips with a single north-south orientation of the first magnetic material to be used in MCMs, which can reduce the cost and complexity of these systems.

Figure 4:
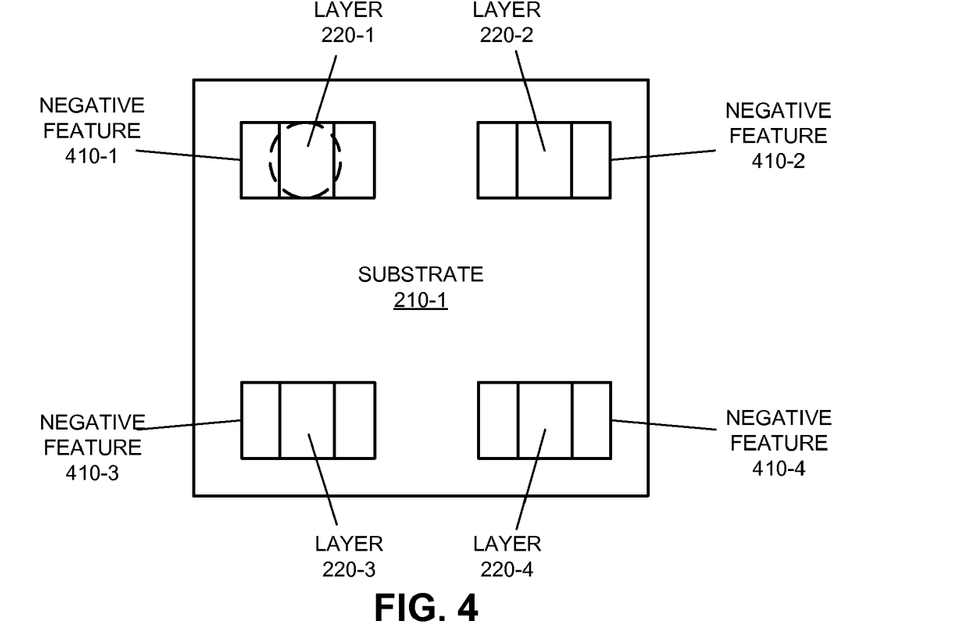
FIG. 4 is a block diagram illustrating a substrate for use in an MCM in accordance with an embodiment of the present disclosure.

In some embodiments, the negative features are elongated, which can improve alignment and assembly. This is shown in FIG. 4, which presents a block diagram illustrating substrate 210-1. This substrate includes elongated negative features 410, which provide a degree of mechanical freedom that positive features (as illustrated by the dashed circle) can move in. Thus, these elongated negative features can accommodate relative motion between substrates in an MCM (for example, due to thermal expansion, shock and/or vibration), and the first magnetic material in layers 220 (which is deposited in the middle of the elongated negative features 410) may provide a corrective or a restoring force that subsequently realigns the substrates.

Note that the use of this mechanical-coupling technique, and the presence of the static magnetic force(s) that help hold the components together, may facilitate alternate configurations for MCMs than the configuration shown in FIG. 1. Several exemplary configurations are shown in FIGS. 5A-5C.

Figure 5A:
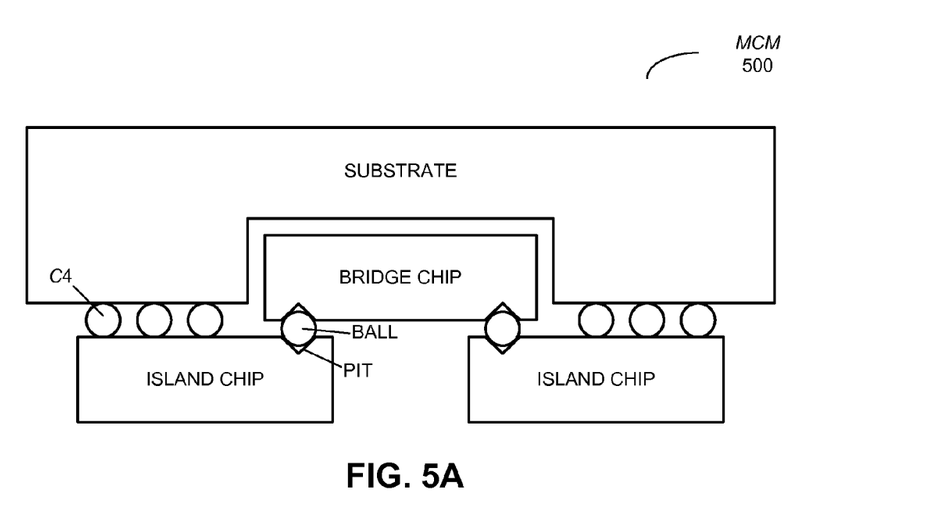
FIG. 5A is a block diagram illustrating an MCM in accordance with an embodiment of the present disclosure.

In FIG. 5A, which presents a block diagram illustrating an MCM 500, the carrier package is coupled to the chips by C4 solder balls, and the cavity for the bridge chip in the carrier package is face down. In some embodiments, there is an insulating underfill around the C4 solder balls, for example, if a flip-chip assembly process is used.

Figure 5B:
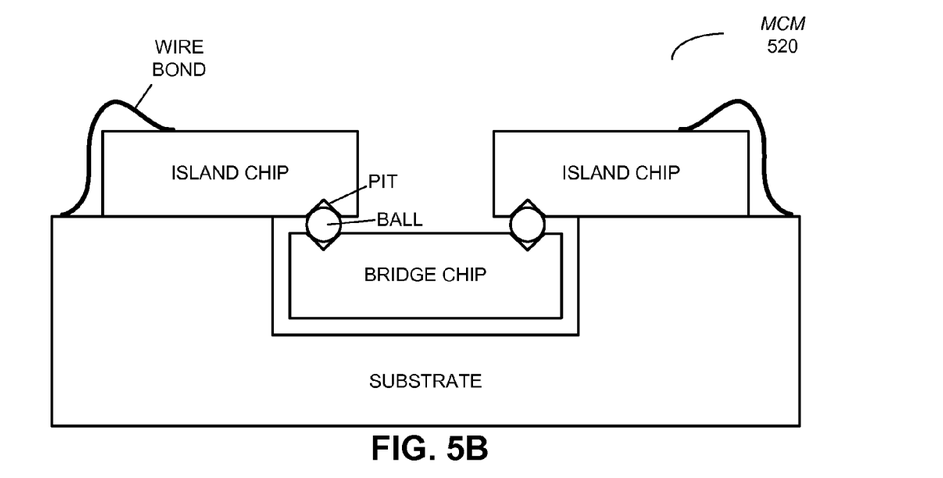
FIG. 5B is a block diagram illustrating an MCM in accordance with an embodiment of the present disclosure.

In FIG. 5B, which presents a block diagram illustrating an MCM 520, the carrier package is coupled to the chips using wire bonding, and the cavity for the bridge chip in the carrier package is face up. Alternatively, FIG. 5C, which presents a block diagram illustrating an MCM 540, shows a carrier package with a face-down cavity and wire bonding.

Figure 5C:
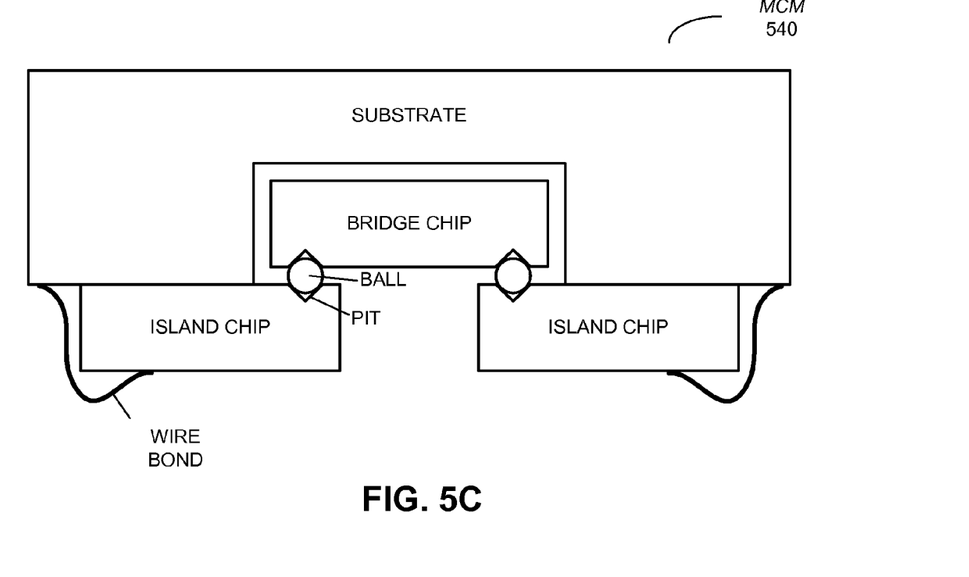
FIG. 5C is a block diagram illustrating an MCM in accordance with an embodiment of the present disclosure.

Note that in the MCMs shown in FIGS. 5A-5C, the magnetic force(s) associated with the magnetic material may facilitate self-alignment and assembly. For example, components may be placed proximate to each other using a pick-and-place tool, and the magnetic force(s) may then align and mechanically couple these components.

As noted previously, the magnetic components in the preceding embodiments may provide remateable mechanical coupling. For example, the magnetic force(s) may be strong enough to hold the components together, but may be overcome (if needed) using a pick-and-place tool. Alternatively, the first material may undergo a ferromagnetic to anti-ferromagnetic phase transition above a given temperature, which may allow an MCM to be disassembled by applying heat (for example, using a hair dryer or a heater in a substrate). In other embodiments, the components in the preceding embodiments may be released by demagnetizing the first magnetic material using an external magnetic field (for example, using AC demagnetization). Furthermore, cold welding or adhesion of components may be reduced or eliminated (thereby facilitating remateable mechanical coupling) by roughening or depositing coatings on surfaces of components, such as positive features 214 (FIGS. 2A-2D) and negative features 216 (FIGS. 2A-2D).

While the preceding embodiments used static magnetic force(s) to facilitate the mechanical coupling, in some embodiments dynamic or time-varying magnetic forces are used. For example, negative features 216 (FIGS. 2A-2D) may be coated with an electrically conductive material and/or a soft magnetic material, and positive features 214 (FIGS. 2A-2D) may include electromagnets. These electromagnets may be selectively turned on or off, which allows the magnetic-coupling force to be dynamically switched on or off. In the off-state, a component (such as the bridge chip) could be 'released' from associated island chips. This capability facilitates the physical disengagement or disconnection of one (or more) chips from a bank of chips. For example, a processor can be disconnected from a main processor array by physically breaking an interconnection. This is quite different from an electronic or optical switch because it involves a physical break of the circuit. In addition to allowing MCMs to be reworked, this capability may offer degrees of freedom in system security and control.

In order to use magnetic balls and pits for alignment and to provide remateable mechanical coupling, the resulting magnetic force typically needs to be strong enough to support the weight of the balls and/or the bridge chip. In the following calculation, the configuration shown in FIG. 2C is used as an example, with permanent magnetic spheres and a ferromagnetic material in the pits on substrates 210 (FIG. 2C). Note that for a silicon bridge chip, which is 5 mm long, 6 mm wide and 150 μm thick, the weight is 0.01 g (where g is the acceleration of gravity at the Earth's surface). Similarly, for a neodimium permanent magnetic sphere, with a radius of 90 μm, the weight per ball is 0.018 mg. Therefore, the weight of the silicon bridge chip and four spheres is around 0.01 g.

The magnetic force is estimated by assuming that the entire surface of a magnetic sphere is in contact with the iron ferromagnetic material in the pits, and that the force is proportional to:

$$\frac{\mu_o B_m^2 A_m}{2},$$

where μ is the permeability of free space, $B_m$ is the magnetic flux density of the permanent magnetic sphere, and $A_m$ is the effective contact area in the pits. With four neodymium permanent magnetic spheres, and assuming closed-flux paths, the total attractive force is 0.19 g, which is nineteen times larger than the force of gravity on the four balls and the bridge chip.

Note that the magnetic fields associated with the first magnetic material and/or the second magnetic material are expected to have negligible impact on circuits on substrates 210 (FIGS. 2A-2D) because the magnetic fields are static.

Figure 6:
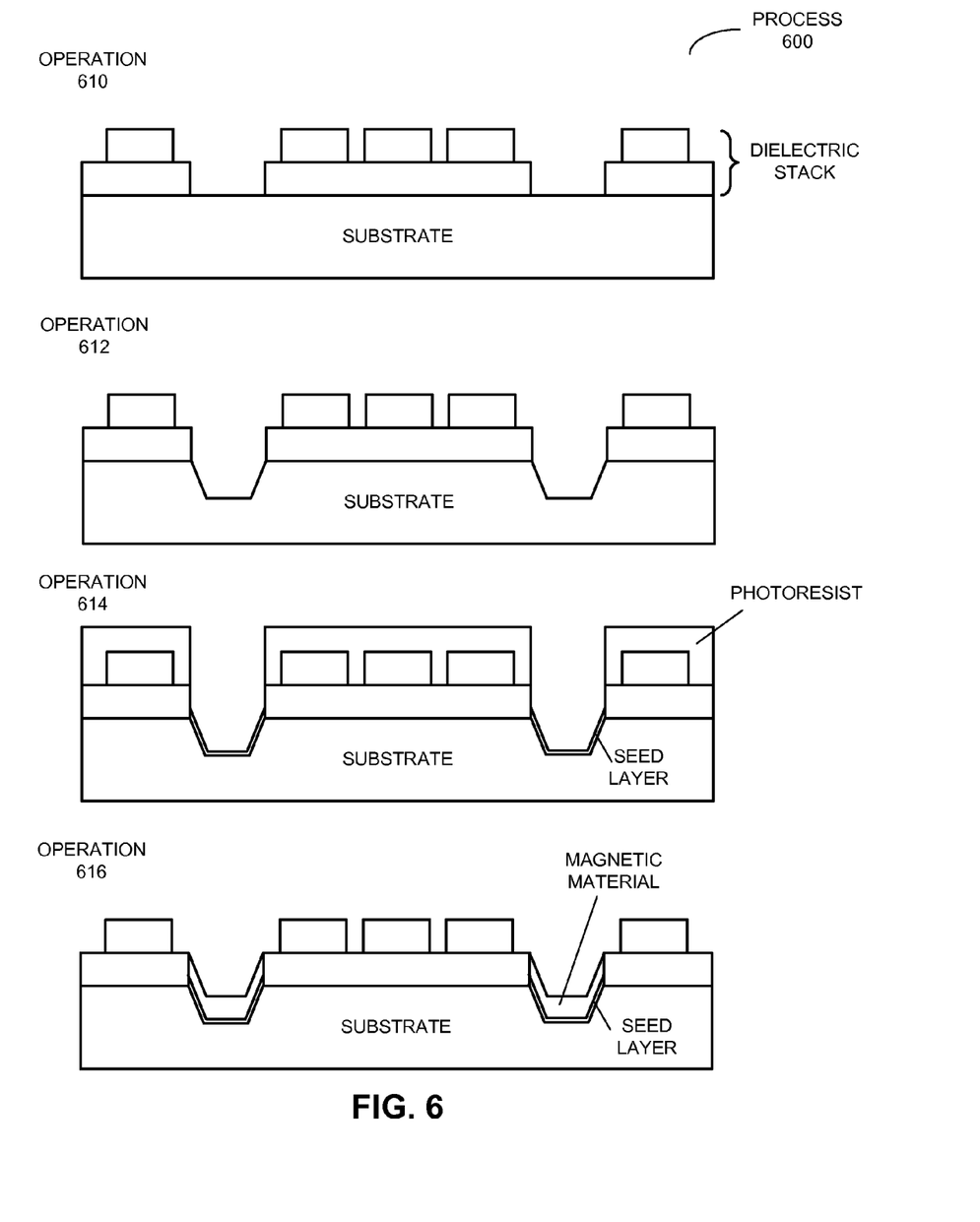
FIG. 6 is a flow chart illustrating a process for fabricating magnetic structures in accordance with an embodiment of the present disclosure.

We now describe embodiments of processes. FIG. 6 presents a flow chart illustrating a process 600 for fabricating magnetic structures (such as magnetic pits), which may be performed after complementary-metal-oxide-semiconductor (CMOS) processing. During this process, openings for the pits may be patterned over keepout regions on a wafer using lithography. Then, using photoresist as a soft mask, the dielectric stacks may be removed by plasma etching processing (operation 610). Subsequently, a layer of silicon nitride may be deposited across the wafer; windows over the pit regions may be processed using a lithography process; and, after nitride removal (for example, by plasma etching), the pits may be formed using wet etching (for example, in a tetramethyl ammonium hydroxide solution or a potassium hydroxide solution) (operation 612).

After pit etching to a defined depth by a timed etch, the silicon nitride layer is removed, and lithography is used to pattern openings over the pits. Next, a seed layer (such as titanium) is deposited in the pits (operation 614).

Moreover, a magnetic material (such as the first magnetic material) is deposited on the seed layer (operation 616). Note that the magnetic material may be deposited using a variety of processing techniques, including: sputtering, electrolytic plating and/or electroless plating. For example, a conductive (metal) magnetic layer may be fabricated by electroless plating of gold and nickel-phosphate.

In an exemplary embodiment, aluminum (such as aluminum-silicon or aluminum-copper) is deposited in the pits on top of a titanium seed layer. After the photoresist has been stripped, the wafers are put through an electroless nickel-gold process. Note that a thick layer of electroless nickel may provide a ferromagnetic material in the pits. Also note that electroless nickel-gold is a common under-bump metallization used to layer input/output pads before bumping. Consequently, this choice of material may serve multiple functions.

However, if a different under-bump-metallization material is used, process 600 may be modified so that the aluminum deposition and the electroless nickel-gold process occur before the nitride hard mask used for pit etching is removed. Note that process 600 may be simplified by eliminating the metal fill in regions where the pits are to be etched. Furthermore, a guard ring around the pit areas may limit dielectric delamination outside of the pits during the pitting process.

Figure 7:
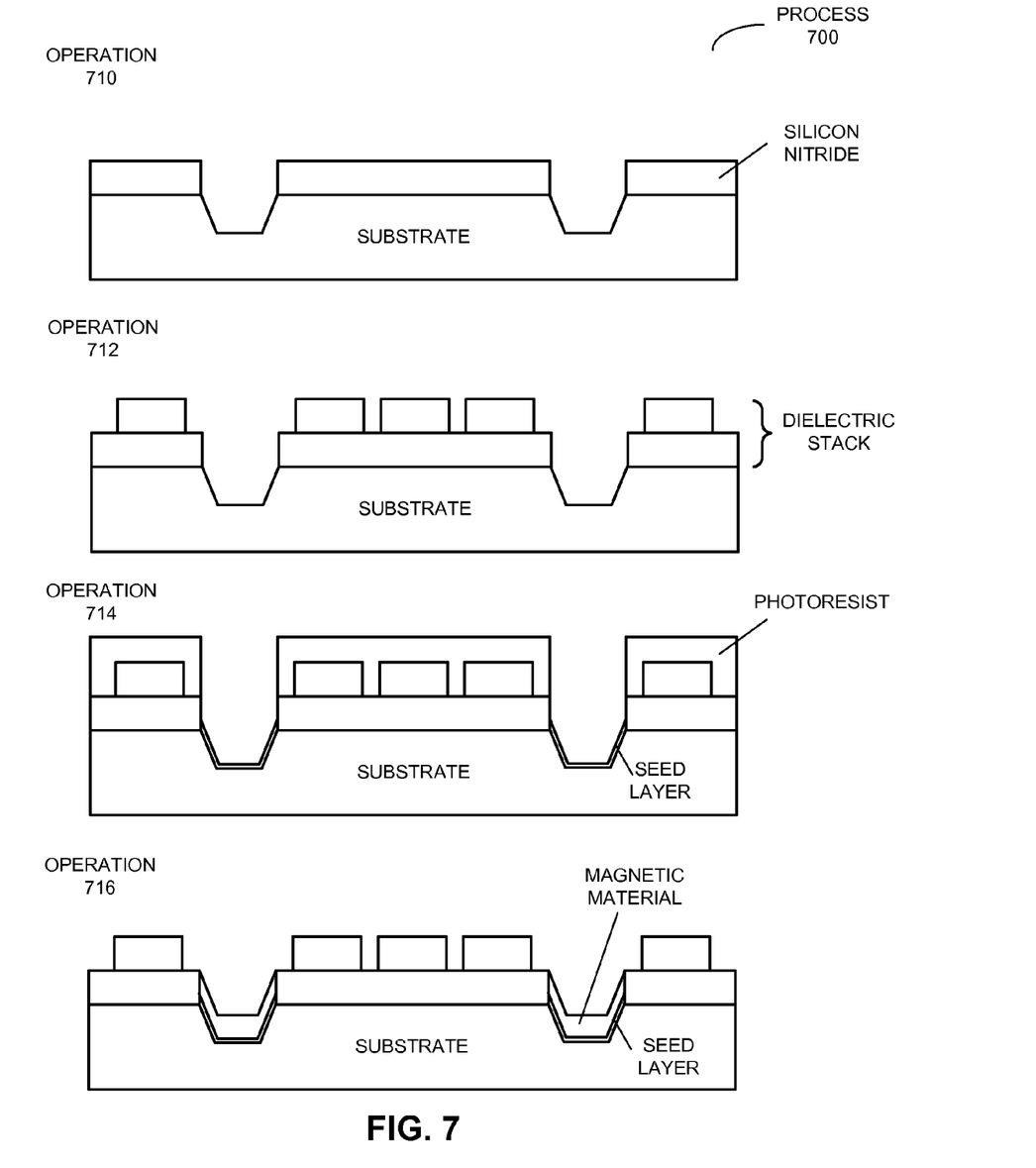
FIG. 7 is a flow chart illustrating a process for fabricating magnetic structures in accordance with an embodiment of the present disclosure.

FIG. 7 presents a flow chart illustrating a process 700 for fabricating magnetic structures, which may be performed prior to CMOS processing. During this process, silicon nitride is deposited on the bare silicon wafer and is patterned to serve as a hard mask. Then, pits are etched in the wafer by wet-etching as described previously (operation 710). Subsequently, the nitride hard mask is then removed and the CMOS dielectric stack is fabricated around the pits. On completion of CMOS fabrication, another lithography operation is used to pattern windows above the pits, which are then cleaned out using dry etch processing (operation 712). Next, a third lithography and liftoff process is used to deposit a seed layer in the pits (operation 714), followed by deposition of the magnetic material (for example, electroless nickel-gold) (operation 716).

Figure 8:
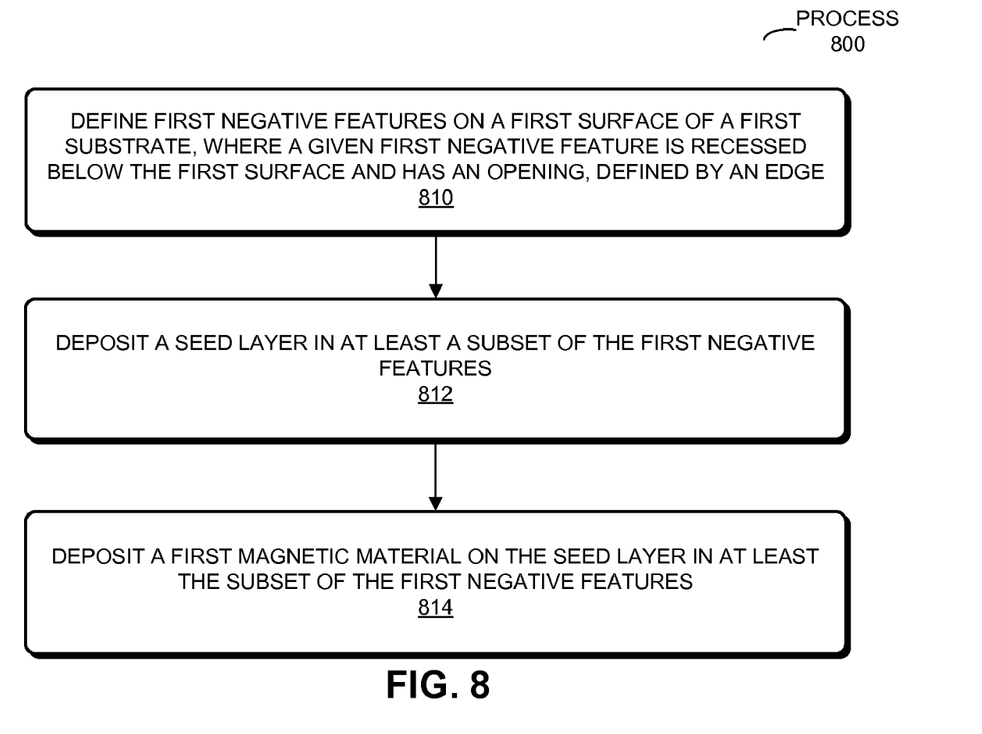
FIG. 8 is a flow chart illustrating a process for fabricating a first substrate for use in an MCM in accordance with an embodiment of the present disclosure.

A more general process is shown in FIG. 8, which presents a flow chart illustrating a process 800 for fabricating a first substrate for use in an MCM, such as MCM 200 (FIG. 2A). During the method, first negative features are defined on a first surface of a first substrate (operation 810), where a given first negative feature is recessed below the first surface and has an opening, defined by an edge. Then, a seed layer is deposited in at least a subset of the first negative features (operation 812). Next, a first magnetic material is deposited on the seed layer in at least the subset of the first negative features (operation 814). Note that the seed layer may define an orientation of a magnetic axis of the first magnetic material. Moreover, the first substrate is configured to mechanically couple in the MCM to a second substrate having a second surface that faces the first surface via positive features in the MCM that are configured to mate with the first negative features. Furthermore, the mechanical coupling is facilitated by the first magnetic material.

In some embodiments, at least some of negative features 216 (FIGS. 2A-2D) are filled to increase the magnetic flux linkage or coupling. For example, in a typical ball-and-pit assembly, the contact area between a ball and a pit may be limited to the line of intersection between the two components. Increasing this contact area may increase the magnetic-flux linkage between the ball and the pit. To achieve this, after the magnetic material is deposited in FIGS. 6-8, a small amount of a suitable low-modulus material may be deposited inside of the pits. This low-modulus material may be thick enough to be compressed during assembly yet thin enough so that it does not limit the magnetic flux. In an exemplary embodiment, the low-modulus material may be a magnetic polymer. Furthermore, the low-modulus material may be deposited using: binding equipment, a stencil printing process, and/or micro-fabrication.

The magnetic structures in the preceding embodiments of the MCMs may facilitate wafer-level ball placement and wafer handling. In particular, after processing and wafer dicing, the pits may be populated with magnetic balls. Strong magnetic forces between the magnetic balls and the pit metal may hold the balls in place at the time of pick, transfer and during wafer flipping.

A variety of techniques may be used to populate the pits with balls in a batch process. For example, a patterned magnetic plate may be used. In this technique, a unique assembly fixture is used to populate the balls into the pits on a wafer or a single chip. This fixture may include a patterned magnetic plate with raised bosses at locations corresponding to the layout of the pits on the wafer or chip. During assembly, the patterned side of the magnetic plate may be placed face-to-face with the pitted side of the wafer/chip. Then, magnetic balls having appropriate dimension may be sprinkled onto the magnetic plate. These balls may attach to the magnetic plate at the raised boss locations. Next, the magnetic plate may be aligned with a pitted wafer in a face-to-face manner, and the two substrates may be brought together and agitated. Note that balls at locations corresponding to pits may remain in place, while the mechanical agitation may cause extraneous balls to roll off.

Alternatively, inductive coupling may be used to populate the balls in the pits. In particular, a fixture wafer with micro-inductors or coils patterned at locations corresponding to pits on the corresponding wafer may be used to position the balls. Note that inductive coupling through a substrate is usually strong. Consequently, when balls are sprinkled onto the inductor wafer, the strong inductive coupling may align the balls and hold them in place. Then, the inductor wafer may be aligned with and brought in contact with a matching pitted wafer. Once the balls are held by the magnetic material in the pits, the micro-inductors may be switched off and the fixture wafer may be removed.

In some embodiments of processes 600 (FIG. 6), 700 (FIG. 7) and/or 800 there are additional or fewer operations. For example, the orientation of the magnetic axis of the first magnetic material in process 800 may be determined, at least in part, by an applied external magnetic field. Moreover, the order of the operations may be changed, and/or two or more operations may be combined into a single operation.

Figure 9:
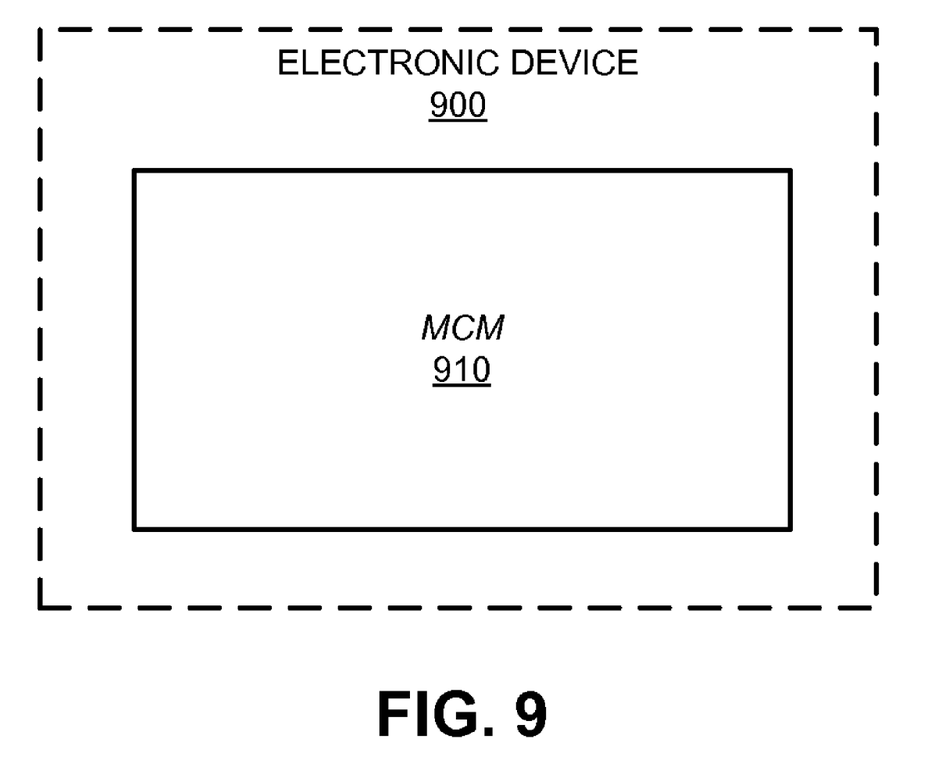
FIG. 9 is a block diagram illustrating an electronic device in accordance with an embodiment of the present disclosure.

One or more of the preceding embodiments of the MCM may be included in a system and/or an electronic device. This is shown in FIG. 9, which presents a block diagram illustrating an electronic device 900. This electronic device includes MCM 910.

In general, an MCM may include an array of chip modules (CMs) or single-chip modules (SCMs), and a given SCM may include at least one substrate, such as a semiconductor die. Note that an MCM is sometimes referred to as a 'macro-chip.' Furthermore, the substrate may communicate with other substrates, CMs and/or SCMs in the MCM using proximity communication of electromagnetically coupled signals (which is referred to as 'electromagnetic proximity communication'). For example, the proximity communication may include: communication of capacitively coupled signals ('electrical proximity communication') and/or communication of optical signals (such as 'optical proximity communication'). In some embodiments, the electromagnetic proximity communication includes inductively coupled signals and/or conductively coupled signals.

Furthermore, embodiments of the MCM may be used in a variety of applications, including: VLSI circuits, communication systems (such as in wavelength division multiplexing), storage area networks, data centers, networks (such as local area networks), and/or computer systems (such as multiple-core processor computer systems). For example, the MCM may be included in a backplane that is coupled to multiple processor blades, or the MCM may couple different types of components (such as processors, memory, input/output devices, and/or peripheral devices). In some embodiments, the MCM performs the functions of: a switch, a hub, a bridge, and/or a router.

Note that electronic device 900 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

MCMs and substrates in FIGS. 2A-5C and/or electronic device 900 may include fewer components or additional components. For example, negative features 216 (FIGS. 2A-2D)

may be defined in layers that are deposited on surfaces 212 (FIGS. 2A-2D), and these negative features may be recessed below a surface of the top layer deposited on substrates 210 (FIGS. 2A-2D). Similarly, positive features 290 (FIG. 2D) may protrude above a local surface, which may be surface 212-2 (FIG. 2D) or a surface of a top layer deposited on substrate 212-2 (FIG. 2D). Thus, in the preceding embodiments a surface of a substrate should be understood to include a surface of a layer deposited on the substrate or a surface of the substrate itself.

Furthermore, although these embodiments are illustrated as having a number of discrete items, these MCMs and electronic devices are intended to be functional descriptions of the various features that may be present rather than structural schematics of the embodiments described herein. Consequently, in these embodiments two or more components may be combined into a single component, and/or a position of one or more components may be changed.

Note that positive features 214 (FIGS. 2A-2C), positive features 290 (FIG. 2D) and/or negative features 216 (FIGS. 2A-2C) may be defined using an additive process (i.e., a material-deposition) and/or a subtractive process (i.e., a material-removal). For example, the process may include: plating, sputtering, isotropic etching, anisotropic etching, a photolithographic technique and/or a direct-write technique. Additionally, these features may be fabricated using a wide variety of materials, including: a semiconductor, metal, glass, sapphire, and/or silicon dioxide.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A method for fabricating a first substrate for use in a multi-chip module (MCM), comprising:
    fabricating first negative features on a first surface of the first substrate, wherein a given first negative feature is recessed below the first surface;
    depositing a seed layer in at least some of the first negative features; and
    depositing a first magnetic material on the seed layer in the at least some of the first negative features, wherein the seed layer defines an orientation of a magnetic axis of the first magnetic material;
    wherein the first substrate is configured to mechanically couple to a second surface of a second substrate in the MCM, wherein the second surface includes:
        positive features that protrude above the second surface and are configured to mate with a first subset of the first negative features, and
        second negative features recessed below the second surface and associated with a second subset of the first negative features to define pairs of negative features; and
    wherein the mechanical coupling is facilitated by the first magnetic material.

2. The method of claim 1, further comprising:
    fabricating the positive features on the second surface, wherein fabricating the positive features on the second surface includes depositing a second magnetic material on the positive features.

3. The method of claim 2, wherein the second magnetic material includes a soft magnetic material at room temperature.

4. The method of claim 1, wherein the first magnetic material includes a hard magnetic material at room temperature.

5. The method of claim 4, wherein the first magnetic material undergoes a ferromagnetic to anti-ferromagnetic phase transition above a given temperature.

6. The method of claim 1, further comprising;
    depositing a second magnetic material in at least some of the first negative features.

7. The method of claim 6, wherein the second magnetic material includes a soft magnetic material at room temperature.

8. The method of claim 1, further comprising:
    mating a microsphere to each negative feature in a given pair of negative features.

9. The method of claim 8, further comprising:
    depositing a second magnetic material on a microsphere before mating the microsphere to each negative feature in a given pair of negative features.

10. The method of claim 9, wherein the second magnetic material includes a soft magnetic material at room temperature.

11. The method of claim 1, further comprising:
    fabricating the second negative features on the second surface, wherein fabricating the second negative features includes depositing the first magnetic material in at least some of the second negative features.

12. The method of claim 11, wherein the first magnetic material includes a hard magnetic material at room temperature.

13. The method of claim 11, wherein fabricating the second negative features includes depositing a second magnetic material on at least some of the second negative features on which the first magnetic material was not deposited.

14. The method of claim 11, wherein, for at least some of the pairs of negative features, only one of the first negative feature and the corresponding second negative feature includes the first magnetic material.

15. The method of claim 14, further comprising:
    mating a microsphere to each negative feature in a given pair of negative features, wherein the microsphere is magnetically attracted to the first magnetic material.

16. The method of claim 14, wherein the second magnetic material includes a soft magnetic material at room temperature.

17. The method of claim 1, wherein the second substrate includes a second magnetic material that provides a flux-return path to at least the subset of the first negative features which include the first magnetic material.

* * * * *